(12) United States Patent
Lee et al.

(10) Patent No.: US 9,341,648 B2
(45) Date of Patent: May 17, 2016

(54) PROBE CARD AND MANUFACTURING METHOD THEREOF

(71) Applicant: MPI Corporation, Hsinchu County (TW)

(72) Inventors: Chung-Tse Lee, Hsinchu County (TW); Chien-Chou Wu, Hsinchu County (TW); Tsung-Yi Chen, Hsinchu County (TW); Ming-Chi Chen, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 183 days.

(21) Appl. No.: 13/972,930

(22) Filed: Aug. 22, 2013

(65) Prior Publication Data

US 2014/0077833 A1  Mar. 20, 2014

(30) Foreign Application Priority Data

Sep. 19, 2012 (TW) .............................. 101134326 A

(51) Int. Cl.
| | | |
|---|---|---|
| *G01R 31/00* | (2006.01) | |
| *G01R 1/04* | (2006.01) | |
| *G01R 3/00* | (2006.01) | |
| *G01R 1/073* | (2006.01) | |

(52) U.S. Cl.
CPC .......... *G01R 1/0491* (2013.01); *G01R 1/07378* (2013.01); *G01R 3/00* (2013.01); *Y10T 29/49126* (2015.01)

(58) Field of Classification Search
CPC .... G01R 1/0491; G01R 1/07378; G01R 3/00; G01R 31/02; G01R 31/26; G01R 1/06711; G01R 1/06727; G01R 1/06733; G01R 1/073; G01R 1/07307; G01R 1/07314; G01R 1/07328; G01R 1/07342; G01R 1/07364; G01R 1/07385
USPC ............... 324/756.03, 750–758.05, 760–768, 324/115, 158.1
See application file for complete search history.

(56) References Cited

U.S. PATENT DOCUMENTS

| | | | |
|---|---|---|---|
| 6,483,328 B1 | 11/2002 | Eldridge et al. | |
| 6,690,185 B1 * | 2/2004 | Khandros .......... | G01R 1/07342 228/180.22 |
| 7,468,610 B2 * | 12/2008 | Miyagi et al. ............ | 324/755.04 |
| 7,471,094 B2 * | 12/2008 | Hobbs et al. ............. | 324/750.22 |
| 7,579,847 B2 | 8/2009 | Miller | |
| 2009/0184727 A1 * | 7/2009 | Kim et al. ...................... | 324/754 |

(Continued)

FOREIGN PATENT DOCUMENTS

| | | |
|---|---|---|
| JP | 2009074958 A | 4/2009 |
| JP | 2009115520 A | 5/2009 |

(Continued)

*Primary Examiner* — Arleen M Vazquez
*Assistant Examiner* — Steven Yeninas
(74) *Attorney, Agent, or Firm* — CKC & Partners Co., Ltd.

(57) ABSTRACT

The probe card includes a substrate, at least two IC boards, and a plurality of probe pads. The IC boards are located on the substrate, and a predetermined distance is formed between the IC boards. Each of the IC boards has a plurality of lead connection points. The probe pads are plated on the IC boards, and are respectively connected to the lead connection points to cover the lead connection points. A probe area is surrounded by the probe pads on each of the IC boards. The probe pads are used to abut against plural probes.

9 Claims, 6 Drawing Sheets

(56) References Cited

U.S. PATENT DOCUMENTS

| | | |
|---|---|---|
| 2009/0212795 A1 | 8/2009 | Williams |
| 2009/0237099 A1* | 9/2009 | Garabedian et al. .......... 324/754 |
| 2011/0121851 A1* | 5/2011 | Lee et al. ................. 324/756.03 |
| 2012/0017428 A1* | 1/2012 | Hsu et al. ..................... 29/602.1 |
| 2013/0069686 A1* | 3/2013 | Wu .......................... G01R 3/00 324/756.03 |

FOREIGN PATENT DOCUMENTS

| | | |
|---|---|---|
| JP | 2010038899 A | 2/2010 |
| JP | 2011133456 A | 7/2011 |
| JP | 2012026741 A | 2/2012 |
| WO | 2012011627 A1 | 1/2012 |

\* cited by examiner

PROBE CARD AND MANUFACTURING METHOD THEREOF

RELATED APPLICATIONS

This application claims priority to Taiwan Application Serial Number 101134326, filed Sep. 19, 2012, which is herein incorporated by reference.

BACKGROUND

1. Technical Field

The present disclosure relates to a test device. More particularly, the present disclosure relates to a probe card and a manufacturing method thereof.

2. Description of Related Art

It has been commonly applied for the technology of using probe cards as high frequency test signal communication connectors between tester and device under test (DUT). However, the conventional probe cards have the following problems:

1. Since electronic products have been miniaturizing and equipped with various functions, the lead connection points of the probe cards for being abutted against probes are becoming smaller and smaller. As a result, the conventional probes cannot be precisely abutted against the lead connection points, which leads to poor contacts during the test.

2. Along with the increasing areas of device under test, such as a 12" wafer, a probe card needs a plurality of IC (Integrated Circuit) boards to be assembled to a printed circuit board. However, because the IC boards are fixed on the printed circuit board by reflowing, melted solders inevitably cause shifts of the IC boards, such that the lead connection points located on the IC boards cannot be precisely aligned with the probes, which results in poor contacts during the test.

SUMMARY

An aspect of the present invention is to provide a probe card, such that the lead connection points of the probe card can be precisely electrically connected to probes.

According to an embodiment of the present invention, a probe card for being abutted against a plurality of probes includes a substrate, at least two IC boards, and a plurality of probe pads. The two IC boards are located on the substrate and has a predetermined distance between the two IC boards. Each of the two IC boards has a plurality of lead connection points. The probe pads are plated on the two IC boards, and are respectively connected to the lead connection points to cover the lead connection points. A probe area is surrounded by the probe pads on each of the IC boards. The probe pads are for respectively being abutted against the probes. A gap between the two probe areas of the two adjacent IC boards is larger than a width of each of the two probe areas.

In an embodiment of the present invention, the gap between the two probe areas of the two adjacent IC boards is twice larger than the width of each of the two probe areas.

In an embodiment of the present invention, the gap between the two probe areas of the two adjacent IC boards is smaller than or equal to 40 μm.

In an embodiment of the present invention, the thickness of each of the probe pads is larger than or equal to 10 μm.

In an embodiment of the present invention, the substrate includes a printed circuit board having a circuit layout. The lead connection points of the two IC boards are electrically connected to the circuit layout of the printed circuit board.

In an embodiment of the present invention, the substrate further includes a multi-layered ceramic board located on the printed circuit board. The two IC boards are located on the multi-layered ceramic board. The lead connection points of the two IC boards are electrically connected to the circuit layout of the printed circuit board by the multi-layered ceramic board.

In an embodiment of the present invention, the probe card further includes a fixing cage. The fixing cage is located on the substrate, and is located under the two IC boards.

In an embodiment of the present invention, the probe card further includes an insulation material layer filled between the probe pads.

In an embodiment of the present invention, a deviation difference between two central point positions of two of the probe pads that are respectively on the same positions of the two IC boards is smaller than 25 μm.

An aspect of the present invention is to provide a probe card manufacturing method.

According to an embodiment of the present invention, a method of manufacturing a probe card includes of the following steps. A. At least two IC boards are provided, and each of the two IC boards has a plurality of lead connection points. B. A limiting layer is formed on each of the two IC boards, and the limiting layer has a plurality of through holes respectively aligned with the lead connection points. C. A conductive material is plated on the two IC boards, such that the through holes are filled with the conductive material to form a plurality of probe pads. D. The probe pads plated on the two IC boards are grinded, such that the top surface of each of the probe pads and the top surface of the limiting layer are the same plane. E. The two IC boards are fixed on the substrate, and a predetermined distance is formed between the two IC boards.

In an embodiment of the present invention, in step B, a lithography technology is used to form the limiting layers having the through holes on the two IC boards by a photo resist.

In an embodiment of the present invention, in step B, a gap between the two adjacent through holes of each of the limiting layers is smaller than or equal to 40 μm.

In an embodiment of the present invention, before step E, the limiting layers located on the two IC boards are removed, such that the probe pads are left on the two IC boards.

In an embodiment of the present invention, the substrate includes a printed circuit board having a circuit layout, and step E further includes: electrically connecting the lead connection points of the two IC boards and the circuit layout of the printed circuit board.

In an embodiment of the present invention, the substrate further includes a multi-layered ceramic board located on the printed circuit board, and in step E, the two IC boards are located on the multi-layered ceramic board, and are electrically connected to the circuit layout of the printed circuit board by the multi-layered ceramic board.

In an embodiment of the present invention, before step E, a probe area is surrounded by the probe pads on each of the IC boards. In step E, when the two IC boards is fixed on the substrate, a gap between the two probe areas of the two adjacent IC boards is larger than a width of each of the two probe areas.

In an embodiment of the present invention, after step E, the probe card manufacturing method further includes: F. assembling a fixing cage on the substrate, and the fixing cage is under the two IC boards.

In an embodiment of the present invention, in step E, the two IC boards are fixed on the substrate by a reflow treatment.

A deviation difference between two central point positions of two of the probe pads that are respectively on the same positions of the two IC boards is smaller than 25 μm.

In the aforementioned embodiments of the present invention, the lead connection points of the probe card can be precisely electrically connected to the probes.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
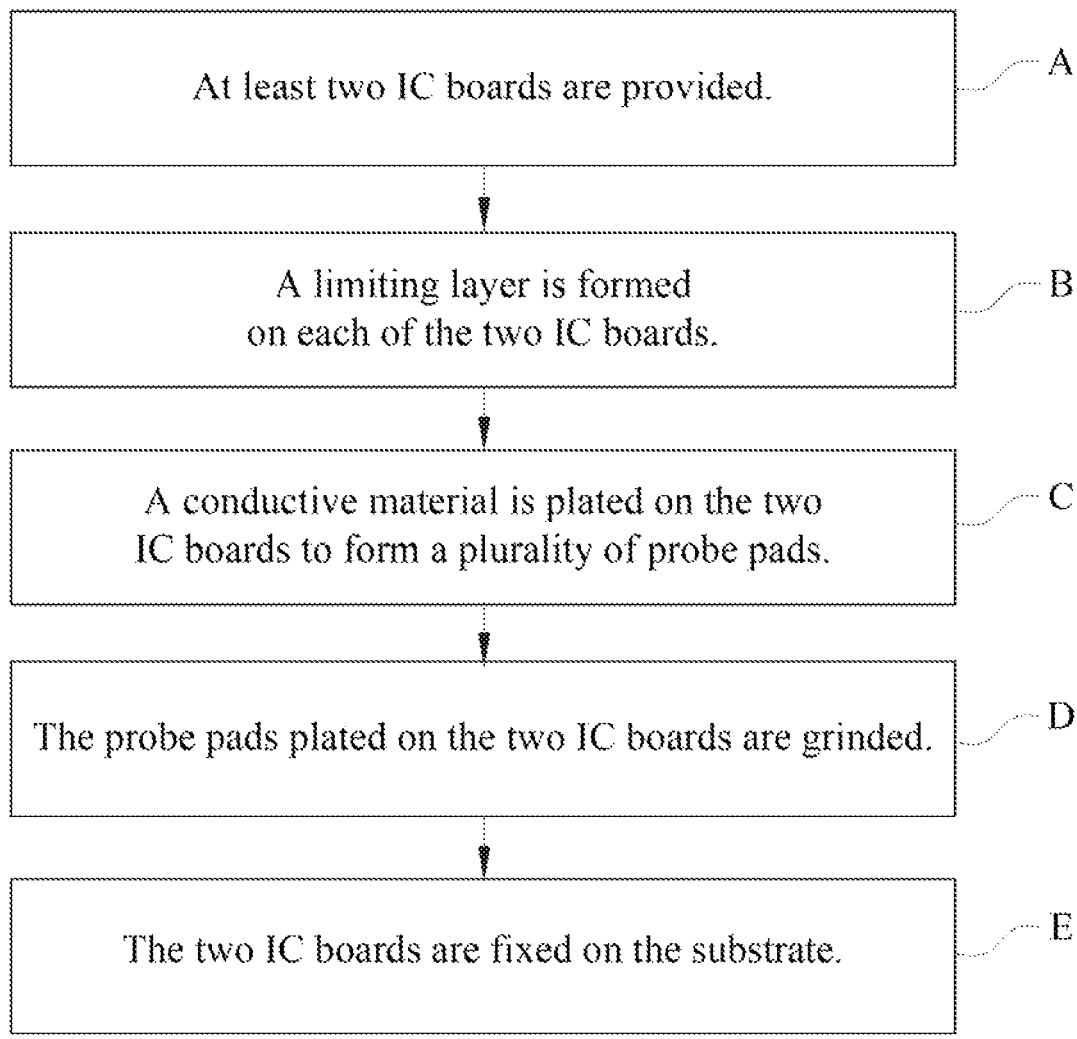
FIG. 1 is a flow chart of a method of manufacturing a probe card according to an embodiment of the present invention.
Figure 2:
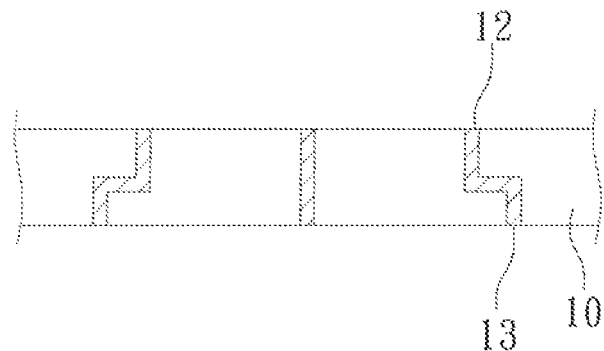
FIGS. 2 to 6 are schematic views of each of the steps of the probe card manufacturing method shown in FIG. 1.
Figure 7:
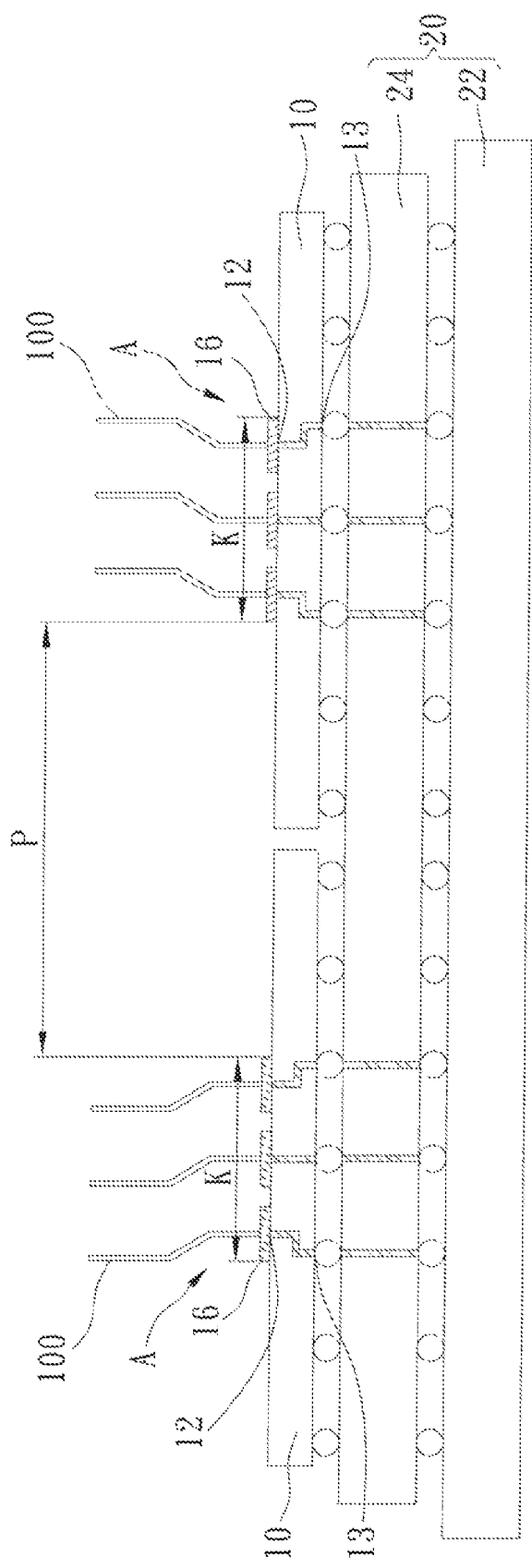
FIG. 7 is a cross-sectional view of a probe card according to an embodiment of the present invention.

Referring to FIG. 1, a method of manufacturing a probe card is provided and includes the following steps:

In step A, at least two IC (Integrated Circuit) boards are provided. Please referring to FIG. 2, a surface of each of the two IC boards 10 has a plurality of lead connection points 12. The lead connection points 12 are used to abut against a plurality of probes for testing. Another surface of each of the two IC boards 10 has a plurality of connection points 13 respectively electrically connected to the lead connection points 12. Generally, the IC board 10 is used to provide a space transforming function. In brief, the pitch between the two adjacent lead connection points 12 of the IC board 10 is smaller than the pitch between the two adjacent connection points 13. In addition, in this embodiment, the IC board 10 is taken from a common multi-layer organic (MLO) board provided by a client terminal. That is to say, the IC boards 10 in the present invention are common package substrates that are used to package products in the client terminal, so that the IC boards 10 are not manufactured by additionally molding. The aforesaid "product" is referred to as the IC in a wafer, and is a device under test that is tested by the probe card (as shown in FIG. 7) of the present invention. As a result, using the common board provided by the client terminal as the space transforming board of the probe card of the present invention can effectively reduce the cost of the IC board.

Figure 3:
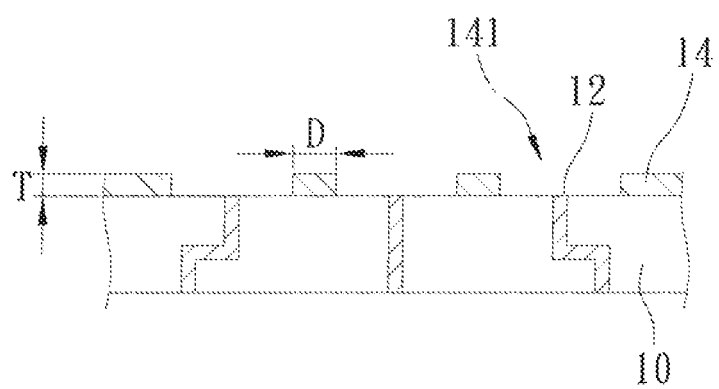

In step B, please referring to FIG. 3, a limiting layer 14 is formed on each of the two IC boards 10, and the limiting layer 14 has a plurality of through holes 141 respectively aligned with the lead connection points 12. In this embodiment, after a photo resist is coated on each of the two IC boards 10, the lithography technology is used to leave the photo resist having the through holes 141 to form the limiting layer 14. The thickness T of the limiting layer 14 is larger than or equal to 10 μm, and a distance D between the two adjacent through holes 141 is smaller than or equal to 40 μm.

Figure 4:
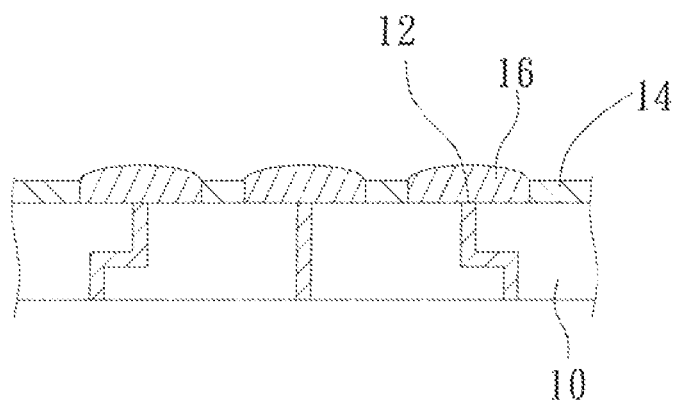

In step C, please referring to FIG. 4, a conductive material is plated on the two IC boards 10, such that the through holes 141 are filled with the conductive material to form a plurality of probe pads 16.

Figure 5:
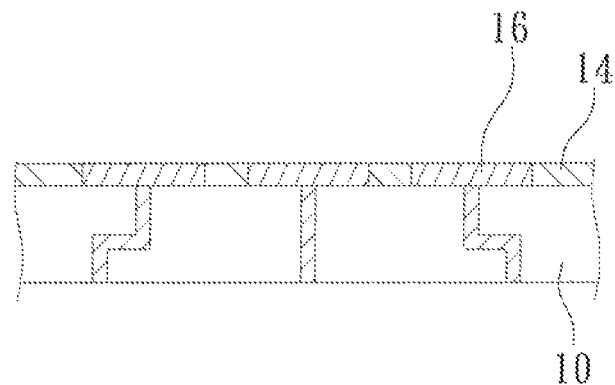
Figure 6:
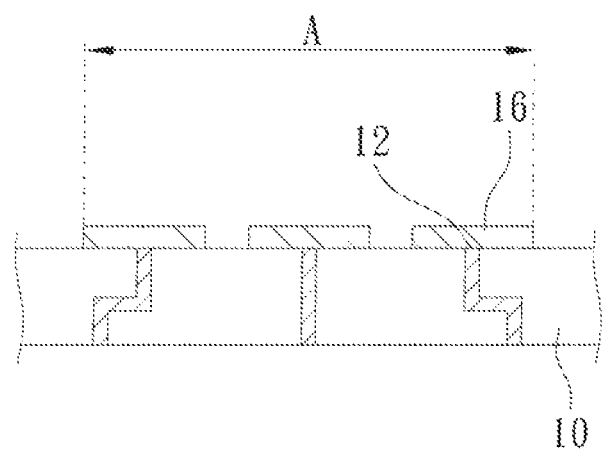

In step D, please referring to FIG. 5, the probe pads 16 plated on the IC board 10 are grinded, such that the top surface of each of the probe pads 16 and the top surface of the limiting layer 14 are the same plane. Thereafter, please referring to FIG. 6, the limiting layer 14 located on the IC board is removed, such that the probe pads 16 having the same shape as the through holes 141 are left on the IC board 10, and a probe area A is surrounded by the probe pads 16.

Figure 8:
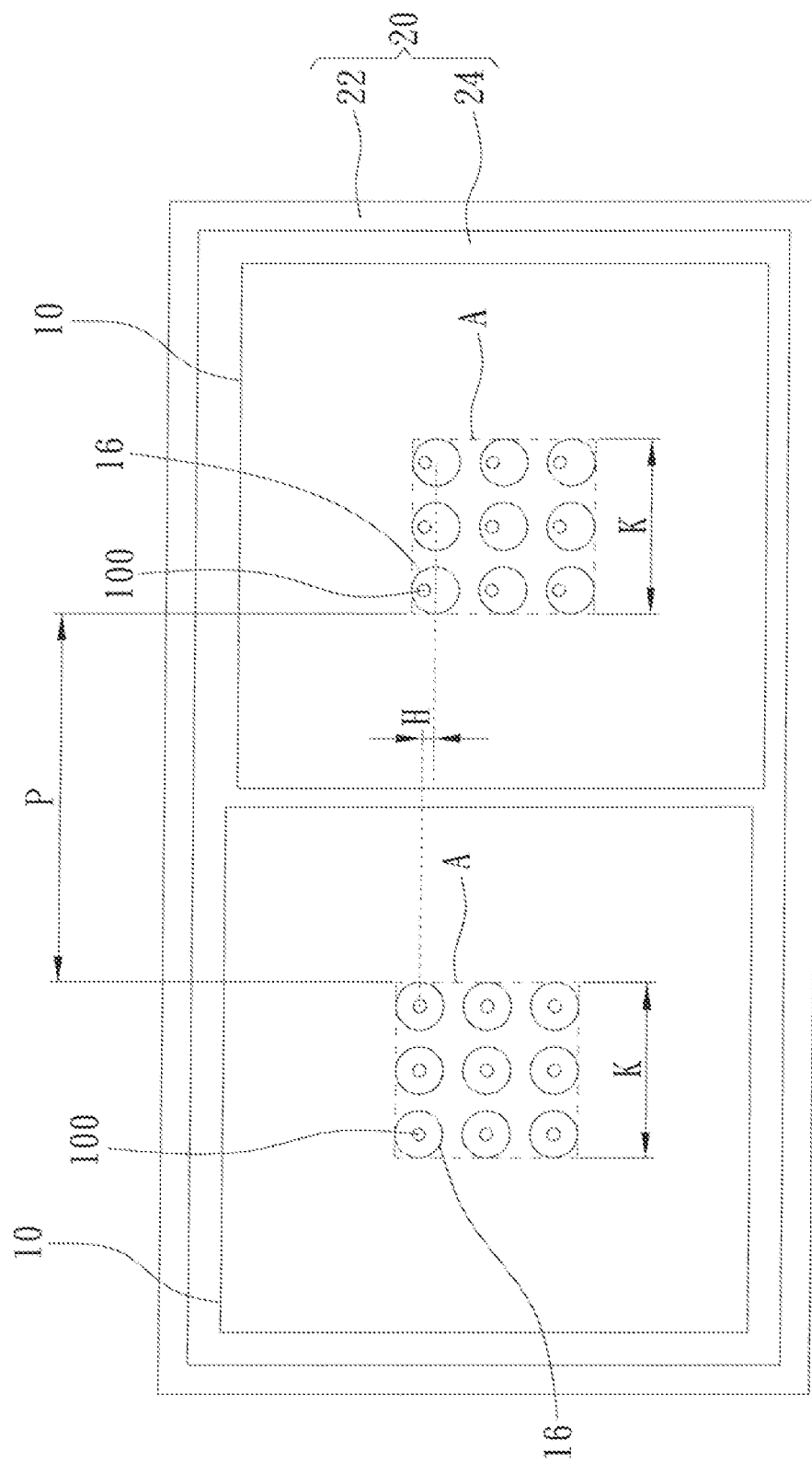
FIG. 8 is a top view of the probe card shown in FIG. 7.

In step E, please referring to FIGS. 7 and 8, the two IC boards 10 are fixed on a substrate 20, and a predetermined distance is formed between the two adjacent IC boards 10, such that a deviation difference H between the two central point positions of two of the probe pads 16 that are respectively on the same positions of the two IC boards 10 is smaller than 25 μm, and the gap P between the two probe areas A of the two adjacent IC boards 10 is larger than the width K of each of the two probe areas A (i.e., a distance between the two edges of the probe pads 16 that are at two opposite sides of the probe area A). In general, the gap P is twice larger than the width K of each of the two probe areas A. Moreover, in this embodiment, the substrate 20 includes a printed circuit board 22 and a multi-layered ceramic (MLC) board 24. The printed circuit board 22 has a circuit layout (not shown). The multi-layered ceramic board 24 is located on the printed circuit board 22, and is electrically connected to the circuit layout. As a result, the two IC boards 10 can be fixed on the multi-layered ceramic board 24 by the reflow treatment. After the lead connection points 12 are electrically connected to the multi-layered ceramic board 24 by the connection points 13, the lead connection points 12 can be electrically connected to the circuit layout of the printed circuit board 22 by the multi-layered ceramic board 24. The multi-layered ceramic board 24 is located on the printed circuit board 22 by the reflow treatment, or the multi-layered ceramic board 24 can be electrically connected to the circuit layout of the printed circuit board 22 by interposers. Two surfaces of the multi-layered ceramic board 24 have connection points, the connection points on one of the two surfaces are electrically connected to the connection points 13 of the two IC boards 10, and the connection points on the other surface are electrically connected to the circuit layout of the printed circuit board 22. A distance between the two adjacent connection points (electrically connected to the connection points 13) on one of the two surfaces of the multi-layered ceramic board 24 may be equal to another distance between the two adjacent connection points (electrically connected to the circuit layout of the printed circuit board 22) on the other surface of the multi-layered ceramic board 24, as shown in FIG. 7. The multi-layered ceramic board 24 also can provide the space transforming function certainly. For example, a distance between the two adjacent connection points on one of the two surfaces of the multi-layered ceramic board 24 is smaller than another distance between the two adjacent connection points on the other surface of the multi-layered ceramic board 24.

As a result, the probe card shown in FIG. 7 can be formed by the aforesaid manufacturing method. The probe pads 16 are used to respectively abut against the probes 100. Since the probe pad 16 is cylindrical and the top surface thereof is a plane design, the probes 100 can be respectively precisely abutted against to the probe pads 16.

Furthermore, the gap between the two adjacent probe pads 16 is smaller than or equal to 40 μm, and the thickness of each of the probe pads 16 is larger than or equal to 10 μm. Therefore, the surface area and the physical strength of each of the probe pads 16 can be increased efficiently. When the probes 100 are respectively abutted against to the probe pads 16, the probe pads 16 can prevent shorting or being penetrated by the probes 100.

Moreover, please referring to FIGS. 7 and 8, when the two IC boards 10 are fixed on the multi-layered ceramic board 24 by the reflow treatment, although melted solder may cause the displacement of the two IC boards 10, each of the probes 100 can be respectively electrically connected to the corresponding lead connection point 12 by the probe pad 16 having the large surface area.

As a result, when a device under test is tested, the printed circuit board 22 is located on a tester (not shown), a test signal generated from the tester is sent to the multi-layered ceramic board 24 by the circuit layout of the printed circuit board 22. Next, the test signal is sent to the two IC boards 10 from the multi-layered ceramic board 24. Thereafter, the test signal is sent to the probes 100 by the corresponding probe pads 16 of the two IC boards 10. Finally, the test signal is transferred to the device under test for testing. When the test signal is returned to the tester, other probes 100 abutted against the device under test transfers the test signal to the tester in a reverse path.

In addition, since the distance between the two adjacent lead connection points 12 of the top surface of the IC board 10 is narrow, and the distance between the two adjacent connection points 13 of the bottom surface of the IC board 10 is wide, such that the probe areas A are respectively formed on the central positions of the two IC boards 10. When plural devices under test are tested, the two adjacent devices under test may not be tested simultaneously, such that the probe card does not achieve the multiplex purpose. However, through the gap P between the two probe areas A of the two adjacent IC boards 10 is larger than the width K of each of the two probe areas A, when testing the devices under test every time, one or several devices under test are located between the devices under test that are tested by the probe card. As a result, one or several devices under test are skippable during one test, so that the probe card achieve the multiplex purpose. Moreover, the skippable devices under test can be tested during another test.

It is worth mentioning that in aforesaid step B, the limiting layers 14 may be made of an insulation material. As a result, in step D, the limiting layers 14 may not be removed from the two IC boards 10. Next in step E, each of the two IC boards 10 having the limiting layer 14 (see FIG. 5) can be directly fixed on the substrate 20. As a result of such a design, the insulation material (layer) can be filled between the probe pads 16, such that the insulating effect between the probe pads 16 is improved. Therefore, when the probes 100 are used, the interference and short between the two adjacent probe pads 16 can be prevented.

Figure 9:
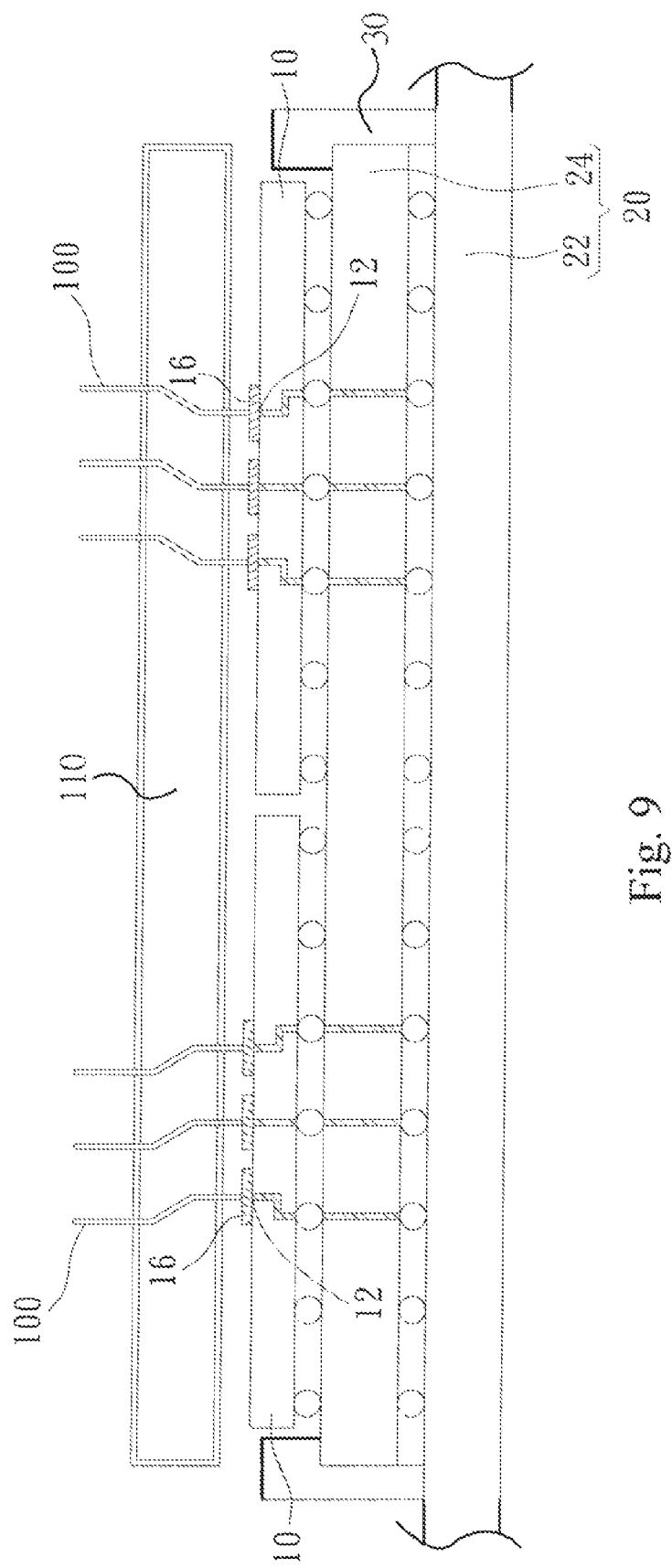
FIG. 9 is a cross-sectional view of the probe card shown in FIG. 7 when a fixing cage is increasingly assembled.

Furthermore, after step E, the probe card manufacturing method may further include:

F. Please referring to FIG. 9, a fixing cage 30 is assembled on the substrate 20, and the fixing cage 30 is under the two IC boards 10. Moreover, at least a portion of the fixing cage 30 is on the multi-layered ceramic board 24 that is under the two IC boards 10, such that the multi-layered ceramic board 24 can be precisely electrically connected to the printed circuit board 22. In addition, a probe head 110 surrounding the probes 100 may be fixed on the printed circuit board 22 by screws (not shown). The probes 100 can pass through the probe head 110, such that the probes 100 can be positioned.

As a result of such a design, the probes 100 can be precisely abutted against the corresponding probe pads 16, and poor contacts may be happened during the test.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A probe card for being abutted against a plurality of probes, the probe card comprising:
   a substrate;
   at least two IC boards located on the substrate by a reflow treatment and having a predetermined distance between the two IC boards, and each of the two IC boards having a plurality of lead connection points, wherein at least one of the two IC boards has an offset that is caused by the reflow treatment; and
   a plurality of probe pads plated on the two IC boards and respectively located on the lead connection points and directly in contact with the lead connection points to cover the lead connection points, wherein a probe area is defined by the region of each of the IC boards covered by the probe pads, the probe pads are for respectively being abutted against the probes, and a gap between the two probe areas of the two adjacent IC boards is larger than a width of each of the two probe areas; a surface area of each of the probe pads is greater than a surface area of the corresponding lead connection point; a distance between two centers of two adjacent lead connection points is equal to a distance between two centers of two adjacent probe pads.

2. The probe card of claim 1, wherein the gap between the two probe areas of the two adjacent IC boards is twice larger than the width of each of the two probe areas.

3. The probe card of claim 1, wherein the gap between the two probe areas of the two adjacent IC boards is smaller than or equal to 40 μm.

4. The probe card of claim 1, wherein a thickness of each of the probe pads is larger than or equal to 10 μm.

5. The probe card of claim 1, wherein the substrate comprises a printed circuit board having a circuit layout, and the lead connection points of the two IC boards are electrically connected to the circuit layout of the printed circuit board.

6. The probe card of claim 5, wherein the substrate further comprises a multi-layered ceramic board located on the printed circuit board, the two IC boards are located on the multi-layered ceramic board, and the lead connection points of the two IC boards are electrically connected to the circuit layout of the printed circuit board by the multi-layered ceramic board.

7. The probe card of claim 6, further comprising:
   a fixing cage located on the printed circuit board for holding the multi-layered ceramic board and located under the two IC boards.

8. The probe card of claim 1, further comprising:
   an insulation material layer filled between the probe pads.

9. The probe card of claim 1, wherein a deviation difference between two central point positions of two of the probe pads that are respectively on the same positions of the two IC boards is smaller than 25 μm.

* * * * *